United States Patent [19]

Althouse

[11] Patent Number: 4,711,014
[45] Date of Patent: Dec. 8, 1987

[54] METHOD FOR HANDLING SEMICONDUCTOR DIE AND THE LIKE

[75] Inventor: Victor E. Althouse, Los Altos, Calif.

[73] Assignee: Vichem Corporation, Stanford, Calif.

[21] Appl. No.: 8,645

[22] Filed: Jan. 29, 1987

Related U.S. Application Data

[62] Division of Ser. No. 770,713, Aug. 29, 1985, Pat. No. 4,667,944.

[51] Int. Cl.$^4$ .......................................... B32B 31/18
[52] U.S. Cl. ................................. 29/412; 29/426.1; 29/426.6; 83/451; 125/13 R; 156/344; 225/2
[58] Field of Search ............ 79/412, 413, 583, 426.4, 79/426.5, 426.6, 426.1; 125/13 R; 156/584, 344; 83/451; 225/2

[56] References Cited

U.S. PATENT DOCUMENTS

| | | | |
|---|---|---|---|
| 1,198,402 | 9/1916 | Bagnall . | |
| 3,158,381 | 11/1964 | Yamamura | 248/362 X |
| 3,190,460 | 6/1965 | Rubin | 248/362 X |
| 3,448,510 | 6/1969 | Bippus et al. | 269/22 |
| 3,465,874 | 9/1969 | Hugle et al. | 206/330 |
| 3,520,055 | 7/1970 | Jannett | 29/423 X |
| 3,562,057 | 2/1971 | McAlister et al. | 29/413 X |
| 3,652,075 | 3/1972 | Thompson | 269/21 |
| 3,707,760 | 1/1973 | Citrin | 29/413 |
| 3,741,116 | 6/1973 | Green et al. | 269/21 |
| 3,757,735 | 9/1973 | Crowe | 269/21 |
| 3,809,050 | 5/1974 | Chough et al. | 269/21 X |
| 3,920,121 | 11/1975 | Miller | 206/330 |
| 4,221,356 | 9/1980 | Fortune | 248/363 |
| 4,285,430 | 8/1981 | Caunt | 206/471 |
| 4,395,451 | 7/1983 | Althouse | 428/141 |
| 4,410,168 | 10/1983 | Gotman | 269/21 |
| 4,428,815 | 1/1984 | Powell et al. | 248/362 X |
| 4,444,078 | 4/1984 | Pearl | 269/21 |
| 4,466,852 | 8/1984 | Beltz et al. | 29/426.4 X |
| 4,643,796 | 2/1987 | Burns | 156/584 |

FOREIGN PATENT DOCUMENTS

| | | | |
|---|---|---|---|
| 2058708 | 4/1981 | United Kingdom | 206/471 |
| 2058658 | 4/1981 | United Kingdom . | |
| 2120141 | 11/1983 | United Kingdom | 269/21 |

OTHER PUBLICATIONS

U.S. patent application Ser. No. 497,430 filed 5/24/83, published in Japan approximately Dec. 1984.

*Primary Examiner*—Frank T. Yost
*Attorney, Agent, or Firm*—Victor R. Beckman

[57] ABSTRACT

Method for handling semiconductor chips and the like objects are disclosed which include the use of a flat flexible film that is supported on a flat porous texturized fabric sheet such as a woven or knit fabric having spaced fiber crossovers. Objects, are supported on the flat flexible film in intimate surface contact therewith for securely holding the same in position by interfacial forces therebetween. Adhesive may be included for increasing the interfacial force. To facilitate removal of objects from the film, the fabric is connected to a vacuum source for drawing portions of the flexible film over and between crossovers in the fabric whereby portions of the flexible sheet are withdrawn from the objects. The contact area and interfacial forces between the flexible sheet and objects is thereby reduced to enable removal of the objects from the sheet using conventional object handling techniques.

9 Claims, 7 Drawing Figures

U.S. Patent  Dec. 8, 1987  4,711,014
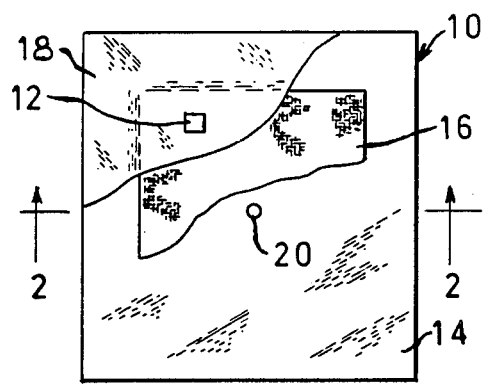
FIG-1
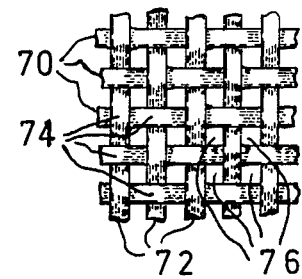
FIG-7
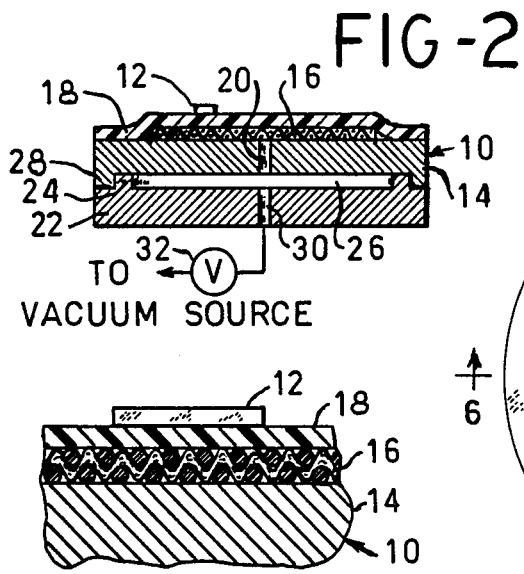
FIG-2
FIG-3
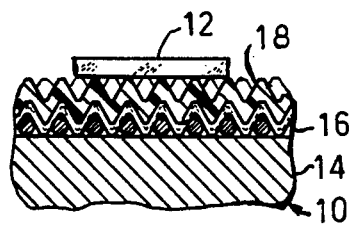
FIG-4
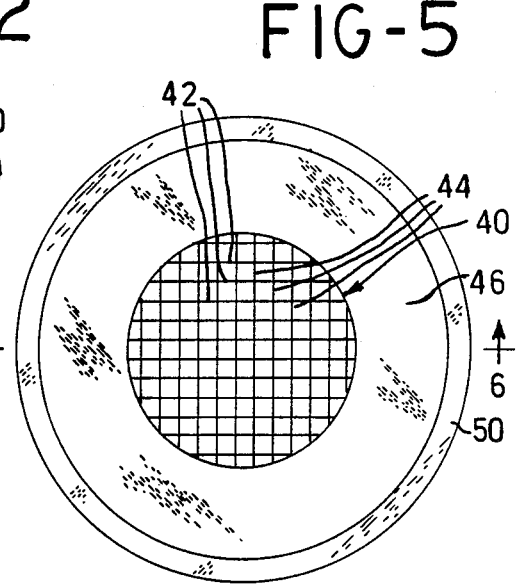
FIG-5
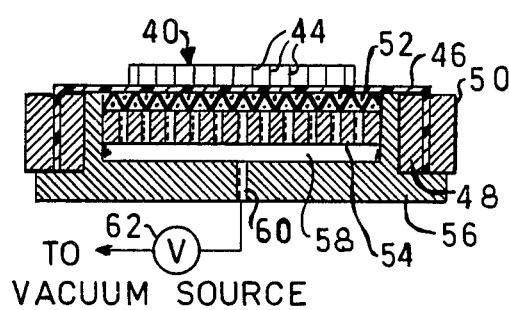
FIG-6

METHOD FOR HANDLING SEMICONDUCTOR DIE AND THE LIKE

This is a divisional of co-pending application Ser. No. 770,713 filed on Aug. 29, 1985, now U.S. Pat. No. 4,667,944.

BACKGROUND OF THE INVENTION

The manufacture of semiconductor and other electronic devices including wafers, die, substrates, chips, and the like, includes steps such as sawing, scribing, breaking, sorting, inspecting, bonding, shipping, storage and additional processing. A number of apparatus and methods are commonly employed by processors of such devices in the handling thereof. One such method involves the use of carriers, or trays, which are formed with a plurality of cavities in the face thereof in which the chips are loaded. Typical disadvantages in the use of cavity trays include:

(a) Many different cavity sizes are needed to accommodate the multitude of chip sizes that are available.

(b) Unless the chip size and cavity size are very closely matched, the chip can rotate within the cavity and make subsequent automatic pickup systems, which require precise chip locations, more difficult.

(c) Chips may turn over within the cavities during shipment, and thus require re-orientation prior to subsequent processing.

(d) Chips may break as they move within the cavities during shipment.

(e) Chips tend to be difficult to place within a cavity, particularly small chips, by automatic equipment, since the ships tend to bounce out.

(f) Chips, particularly small chips, tend to easily dislodge and fly out of the tray, unless particular care is exercised, when the cavity tray is opened.

Other methods for holding and handling chips include:

(a) A film that contains a pressure sensitive adhesive mounted in a frame. Such frames are often difficult to handle and require special equipment to remove chips from the adhesive film. Commonly, this includes a probe from the bottom of the film to push the chip from the adhesive, and a vacuum tool from the top to capture and remove the chip. The probe sometimes causes the chip to be damaged.

(b) A non-adhesive elastomeric film that holds chips in place because of intimate surface contact between film and chip. Such films are ordinarily mounted on rigid substrates. Predominantly, small chips are handled on this type of system since larger ones, with increased surface contact area, are difficult to remove by ordinary vacuum techniques.

(c) A system similar to (b) where the surface of the elastomer has been texturized to reduce the surface contact between chip and elastomer, and thus allow for the easier removal of both larger and smaller chips. This system is disclosed in U.S. Pat. No. 4,395,451 issued July 26, 1984 entitled Semiconductor Wafer and Die Handling Method and Means, by the present inventor. While this system has a number of advantages, it is sometimes difficult to control the degree of texturization so that sufficient surface contact is maintained to retain chips in place.

(d) A system which includes a base member having a substantially flat upper face formed with recess means therein, together with a thin flexible film supported thereon upon which semiconductor chips, or the like, are supported. To facilitate removal of chips from the film the film is drawn downwardly into the recess means by reducing the gas pressure in the recess means thereby reducing the surface contact between the chip and film which, in turn, reduces the force by which the chip is attached to the film. For use with small objects, formation of suitable recess means in the base member is difficult, and may require costly tooling. Such a system is shown in copending U.S. patent application Ser. No. 497,430 filed May 24, 1983 entitled Method and Means for Handling Semiconductor and Similar Electronic Devices, which invention is assigned to the assignee of the present invention.

SUMMARY AND OBJECTS OF THE INVENTION

An object of this invention is the provision of method and means for handling semiconductor die and the like which avoid the above-mentioned and other shortcomings of prior art arrangements.

An object of this invention is the provision of a carrier for handling semiconductor die, wafers, chips, or like devices, upon which the devices are retained in desired position during handling, yet are readily removed from the carrier using conventional vacuum collets, tweezers, or the like.

An object of this invention is the provision of an improved carrier which is readily manufactured and is not only useful for handling large semiconductor die, or the like, but is particularly well adapted for use in handling semiconductor die, or the like, of very small size.

The above and other objects and advantages of this invention are achieved by use of a base member having an upper face covered by a pervious texturized sheet such as a sheet of knit or woven fabric, or the like. A thin flexible film is supported on the sheet with the perimeter thereof in sealing engagement with the base member. Chips, or the like, to be handled are supported on the upper face of the thin flexible film in full surface contact with the film, and interfacial forces (including adhesive forces) tightly hold the chips in position on the film. To allow for removal of chips from the film, the film is drawn downwardly into interstices, or crevices, in the face of the fabric sheet by reducing the gas pressure at the fabric sheet thereby reducing the surface contact between the chip and film which, in turn, reduces the force by which the chip is attached to the film. Preferably the flexible film is resilient so as to return to a flat condition in preparation for reuse of the carrier when gas pressure is returned to normal; i.e. restored to ambient pressure. The base member may be adapted for support on a vacuum chuck, or table, to facilitate connection of the carrier to a source of reduced gas pressure.

BRIEF DESCRIPTION OF THE DRAWINGS

The invention, together with other objects and advantages thereof, will be better understood from the following description when considered with the accompanying drawings. In the drawings, wherein like reference characters refer to the same parts in the several views:

FIG. 1 is a plan view of a carrier embodying the present invention showing a chip carried thereby, portions of the cover film and pervious texturized sheet being shown broken away for clarity;

FIG. 2 is a sectional view taken along line 2—2 of FIG. 1;

FIG. 3 is an enlarged fragmentary sectional view of the carrier showing a chip in full face contact with the cover film;

FIG. 4 is an enlarged fragmentary sectional view which is similar to that of FIG. 3 but showing the flexible film drawn down into recesses in the texturized sheet for reduced surface contact between the chip and film;

FIG. 5 is a plane view of a modified form of this invention;

FIG. 6 is a sectional view taken along line 6—6 of FIG. 5, and

FIG. 7 is an enlarged fragmentary plan view showing a type of fabric which may be employed in this invention.

Reference now is made to FIGS. 1 and 2 of the drawings wherein one form of novel carrier 10 embodying this invention is shown, which carrier is adapted for use in handling semiconductor chips, wafers, or other smooth-surfaced articles. It is particularly well adapted for handling articles of very small size such as semiconductor chips with dimensions as small as, say, 0.010 inches square, because fabric mesh is readily available in these small geometries. In FIGS. 1-4, a single chip 12 is shown carried by carrier 10 which is adapted to hold a plurality of chips.

The illustrated carrier comprises a base member 14 formed of a suitable rigid material such as glass, plastic, metal, or the like. A porous, or foraminous, surface-texturized sheet 16, such as a fabric sheet, is supported by the base member, and in the illustrated arrangement the sheet covers the central portion of the upper face of base member 14. A non-porous, air-impermeable, thin flexible film, or sheet, 18 covers the fabric sheet and extends outwardly beyond the perimeter thereof. The marginal edges of flexible sheet 18 are attached to base member 14 by any suitable means as, for example, by use of an adhesive, such as a pressure sensitive adhesive, not shown, or simply by non-adhesive frictional and interfacial forces between a smooth portion of the base member and the marginal edges of cover 18, to provide a sealing engagement between the base member 14 and cover 18 along the marginal edges, or perimeter, thereof.

As noted above, surface-texturized fabric sheet 16 which is sandwiched between cover sheet 18 and base member 14, is porous, or permeable to allow for the passage of air therethrough. Consequently, a vacuum produced anywhere on sheet 16 is transmitted therethrough to flexible sheet 18 supported thereon. In the illustrated arrangement, fabric sheet 16 is adapted for connection to a low air pressure, or vacuum, source through a passageway 20 formed in the base member 14. The texturized fabric sheet 16 includes an array of fiber crossover points and spaces between the crossovers. As a result, as best seen in FIG. 3, there is essentially point contact with base 14 upon which the fabric sheet is supported, and with the flexible cover sheet 18 supported thereby. The effect of this structure is to allow for an easy distribution of a vacuum under the entire surface of the fabric, even though the fabric appears to lie flat on the supporting base 14.

A vacuum chuck, or table, 22 may be used for connection of passageway 20 to a vacuum source. The illustrated chuck includes vertical walls 24 which define a recess 26 in the upper face thereof. Downwardly extending walls 28 on the base member 14 surround the walls 24 of the chuck when the base member is positioned on the chuck, and a substantially fluid tight chamber is defined between the bottom of the base member 14 and recess 26 in the chuck. A passageway 30 in the vacuum chuck is provided for connection of the recess 26 to a vacuum, or low pressure, source through a control valve 32. Low pressure in the chamber between the chuck 22 and base member 14 is communicated through the passageway 20 in the base member and thence through the permeable, or porous, texturized fabric sheet 16 to the impermeable flexible sheet 18 to draw portions of sheet 18 into crevices, or interstices, in the upper face of the texturized fabric sheet 16.

The cover sheet 18 may comprise, for example, an elastomeric member having a smooth upper face to provide for high interfacial retention forces between the sheet and the smooth-faced device, such as chip 12, supported thereon. Interfacial retention forces may be increased, if desired, by use of an adhesive, such as a pressure sensitive adhesive, not shown, at the upper face of the cover sheet 18. For decreased interfacial retention forces, a cover sheet 18 having a texturized upper face may be used. In any event, interfacial retention forces are provided for securely holding the device 12 on the cover sheet 18 such that the device can not be readily and/or conveniently removed using conventional tweezers or vacuum techniques while the sheet 18 is in the flat position illustrated in FIGS. 1-3.

To facilitate removal of the device, or chip, 12 from the cover sheet 18, surface contact between the cover sheet and device is reduced by drawing portions of the cover sheet 18 into crevices, or interstices, in the upper face of texturized fabric sheet 16 by application of a vacuum thereto. Texturized sheet 16 simply may comprise a woven, knit, braid, lace, knit-sew, or like fabric made of natural or synthetic "over and under" crossing fibers or yarns, which fabric is inherently porous and has a texturized surface. With a vacuum supplied to the carrier, sheet 18 is provided with an undulated surface, as seen in FIG. 4, by drawing of portions of sheet 18 over the crossovers and down between the crossovers of the fabric sheet 16 upon which sheet 18 is supported. As a result, portions of sheet 18 are withdrawn from chip 12 without the formation of a vacuum therebetween, thereby reducing the interfacial retention forces between sheet 18 and chip 12. By reducing the magnitude of the force by which the chip is attached to the sheet 18, the chip is readily removable from the sheet as by use of a vacuum needle, tweezer, or the like.

With the present invention, the surface of the flexible supporting sheet 18 is converted from a flat condition, for full surface contact with the device 12, to a wavy or undulating condition for a reduction in the surface contact between sheet 18 and devices supported thereon, without the formation of a vacuum therebetween. Although the invention is adapted for use with a wide variety of chip sizes, it is particularly well adapted for use with very small chips. For use with small chips, fabric sheet 16 is selected having a high mesh count per inch which provides for closely spaced high points upon which the flexible sheet 18 is supported whereby even small chips overlie a plurality of such points. As a result, small chips remain level when portions of the sheet 18 are drawn downwardly into depressions between the closely spaced high crossover points; it being highly desirable that the chips remain level when a vacuum is supplied to the device to facilitate removable of the chips from the carrier.

Fibers employed in the fabric may have various cross-sectional shapes including, for example, circular, oval, circular serrated, lobal, triangular, dog-boned, and the like. Synthetic fibers may be of various chemical compositions including, for example, glass, metal, plastic, graphite, or the like. Fibers may be composed of blends of dissimilar fibers including, for example, bi-component fibers. Fabrics made of yarn include, for example, spun or filament yarns. Obviously, coated fibers and coated fabric, such as metalized fiber or fabric may be used so long as the texturized fabric is porous to allow for the drawing of air therethrough. The present invention is adapted for use with a wide variety of fabrics; the fabric employed being selected for the particular use to be made of the carrier.

Reference now is made to FIGS. 5 and 6 wherein a modified form of this invention is shown for use in removing chips from a resilient diaphragm following cutting of a wafer into individual dice. A wafer 40 is shown which has been cut along parallel lines 42, and parallel lines 44 perpendicular to lines 42. The wafer is adhesively secured to a flexible diaphragm 46 which is stretched over an annular holder, or frame 48. (See FIG. 6.) The diaphragm is attached to the holder by an outer annular clamping member 50. Wafer holders of this general type are well known in the art.

To facilitate removal of individual die from the diaphragm, the diaphragm is placed on a texturized porous fabric sheet 52 which is supported on an aperture plate 54. The plate 54 is attached to a base member 56 formed with a cavity 58 within which the plate is located. Any suitable means, not shown, may be used for attachment of the plate to the base member. An aperture 60 in the base member is adapted for connection to a vacuum, or low, pressure source through valve 62. As with the arrangement shown in FIGS. 1 through 4, described above, when a vacuum is applied to the fabric sheet 52 the flexible diaphragm 46 is drawn over the crossovers and between the crossovers in the fabric to effect the desired reduction in surface contact with dice, without the formation of a vacuum between the dice and diaphragm, thereby reducing the interfacial forces between the dice and diaphragm. The dice then are individually removable from the diaphragm using conventional chip-handling equipment.

In operation, a stretched resilient diaphragm 46 is supported on the circular frame 48 and clamped thereto by clamping ring 50. A wafer 40 is attached to the stretched diaphragm 46 as by use of an adhesive, not shown. The frame is located in a cutting machine for cutting along lines 42 and 44. After the wafer is cut into dice, other operations may be performed on the dice while attached to the diaphragm, as required. When it is desired to remove the dice from the diaphragm, the frame 48 is positioned over the vacuum release mechanism shown in FIG. 6, with the bottom surface of the diaphragm resting on fabric 52. A sufficiently fluid tight engagement is provided between the frame and base member 56 to allow for the production of a low pressure within cavity 58 when connected to a vacuum source. Portions of the flexible diaphragm 46 are drawn into pores of the fabric 52, between high points at the fiber crossover thereof, to reduce surface contact between the dice and diaphragem. As a result, retention forces between the diaphragm and dice are reduced whereby individual die may be removed from the diaphragm using conventional vacuum pick-up devices, or the like.

FIG. 7 illustrates a fabric of the type which may be usedin this invention. There, a fabric with a plain weave comprising interlacing wrap and filling fibers 70 and 72, respectively, is shown. The illustrated fabric includes evenly spaced crossovers 74 with opening 76 therebetween, into which openings the cover sheet is adapted to be drawn when articles are to be released from the carrier in which the fabric is incorporated.

In one embodiment of the present invention, a 76 mesh per inch monofilament nylon woven fabric having mesh openings of 0.085 inches, fiber diameter of 0.0048 inches, and fabric thickness of 0.0091 inches was placed on a flat surface with a small hole in the center. A silicone elastomeric film approximately 0.006 inches thick was placed over the fabric and a vacuum seal was established by extending the film beyond the perimeter of the fabric to make intimate contact with the flat surface. A small chip approximately 0.020 inches on an edge, was placed over the flat film before the system was evacuated and this resulted in a high level of retention between the film and chip. When a vacuumn was drawn under the fabric, the film was drawn over the crossovers of the fabric structure and into the mesh openings. This resulted in reduced surface contact between the chip and the film and correspondingly reduced retention as evidenced by easy movement of the chip on the surface of the film.

The invention having been described in detail in accordance with requirements of the patent statutes, various other changes and modifications will suggest themselves to those skilled in the art. For example, the surface of the base member 14 may be formed with grooves which are adapted for connection to a vacuum source for distribution of the vacuum at the lower face of the fabric sheet 16. Alternatively, the fabric sheet may be supported in a flat condition on protuberances formed at the upper face of the base member. Although the use of protuberances, grooves, a plurality of holes, or the like, at the upper face of the base member is not required to distribute the vacuum to the lower surface of the fabric sheet, they may be included in the structure so long as the fabric is supported in a flat position. It will be apparent, then, that the use of a flat upper face on base member 14, as shown in FIGS. 1–4, is not required for proper support of the fabric. If the base memberis formed with protuberances, grooves, a plurality of holes, or the like, portions of the fabric sheet may be urged into the grooves, holes, or recesses surrounding the protuberances, when a vacuum is supplied to the fabric sheet by force of the non-porous cover sheet thereon. Nevertheless, where the fabric is positively supported, portions of the flexible cover sheet will be drawn into the fabric sheet between fiber crossovers.

As noted above, a wide variety of fabrics are available for use with the present invention. Factors to be considered in the selection of a fabric include the size of devices to be handled, operating conditions, and the amount that retention forces between the flexible film and devices supported thereon are to be reduced for ready removal of the devices from the film when the film is drawn into recesses between fiber crossover points in the fabric. Also, available fabrics can be readily affixed to surfaces of substantially any size whereby carriers of various sizes can be readily constructed. As noted above, the use of a fabric with over and under fiber weaves or knits results in essentially point contact with the base member which allows for an easy distribution of vacuum under the entire surface of the fabric regardless of size.

The non-porous flexible cover sheet 18 may be non-elastic, if desired, in which case it would be adapted for a single use whereas an elastic cover sheet may be reused if not damaged during processing of objects supported thereon. Also, a laminated flexible cover sheet 18 may be employed. For example, the flexible sheet may comprise a base of plastic film and an upper elastomeric member.

Obviously, the cover sheet 18 may be bonded, or adhered, to the fabric sheet 16 at the crossover points to provide for a unitary member which is carried by base member 14. By attaching the cover sheet at only the crossover points of the fabric sheet, the cover sheet still may be drawn into the fabric sheet between crossovers. Similarly, the fabric sheet may be affixed to the base member 14 at crossover points, if desired. An adhesive, such as a pressure sensitive adhesive, may be used, for example, for attachment of the fabric sheet to the cover sheet and/or base member.

It is intended that the above and other such changes and modifications shall fall within the spirit and scope of the invention as defined in the appended claims.

I claim:

1. A method of handling objects such as semiconductor chips, wafers, or like devices, said method including,
   attaching an object to an air-impermeable flat sheet member by interfacial forces between said sheet member and said object,
   locating the flat sheet member on a porous texturized fibrous fabric having spaced high points at fiber crossovers,
   drawing portions of said sheet member over said high points and between said crossovers by connection of said fabric to a vacuum source for withdrawing portions of said sheet member away from said object without forming a vacuum between said sheet member and said object for reducing the contact area and interfacial forces between said sheet member and said object to allow for the ready removal of said object from said sheet member.

2. A method as defined in claim 1 wherein said object comprises a wafer, the method including
   cutting said wafer into dice before locating the flat sheet member on said fabric, individual dice being readily removable from said sheet member when a vacuum is drawn on the fabric.

3. A method as defined in claim 1 wherein the step of attaching an object to the flat sheet includes use of an adhesive for increased interfacial forces between said sheet member and said object.

4. A method of handling objects such as semiconductor chips, wafers, or the like, said method including,
   attaching an object to an air-impermeable flat sheet member by interfacial forces between said sheet member and said object,
   locating the flat sheet member on a surface-texturized, fibrous, porous fabric sheet,
   reducing the pressure of gas at said fabric sheet to withdraw portions of said sheet member away from said object without forming a vacuum between said sheet member and said object for reducing the contact area and interfacial forces between said sheet member and said object to allow for the ready removal of said object from said sheet member.

5. A method as defined in claim 4 wherein said object comprises a wafer, the method including
   cutting said wafer into dice before locating the flat sheet member on said fabric sheet in preparation for reducing the pressure of gas at the fabric sheet and subsequent removal of individual dice from the sheet member.

6. A method as defined in claim 4 wherein the step of attaching an object to the flat sheet includes use of an adhesive for increased interfacial forces between said sheet member and said object.

7. A method of handling objects such as semiconductor chips, wafer, or like devices, said method including,
   attaching an object to an air-impermeable flat sheet member by interfacial forces between said sheet member and said object,
   locating the flat sheet member on a porous woven fabric sheet having spaced high points at fiber crossovers with interstices between adjacent crossovers, which fabric sheet is supported in a substantially flat position,
   drawing portions of said sheet member into interstices between said crossovers by connection of said fabric sheet to a vacuum source such that portions of said sheet member are withdrawn from said object without forming a vacuum between said sheet member and said object thereby reducing the contact area and interfacial forces between said sheet member and said object to allow for the ready removal of said object from said sheet member.

8. A method as defined in claim 7 wherein said object comprises a wafer, the method inclduing
   cutting said wafer into dice before locating the flat sheet member on said fabric sheet in preparation for drawing portions of said sheet member into interstices in said fabric sheet.

9. A method as defined in claim 7 wherein the step of attaching an object to the flat sheet includes use of an adhesive for increased interfacial forces between said sheet member and said object.

* * * * *